United States Patent [19]

Ueda

[11] Patent Number: 5,435,681
[45] Date of Patent: Jul. 25, 1995

[54] PUSHER DEVICE FOR PLATE-FORM ARTICLES

[75] Inventor: Hisashi Ueda, Musashimurayama, Japan

[73] Assignee: Kabushiki Kaisha Shinkawa, Tokyo, Japan

[21] Appl. No.: 64,450

[22] Filed: May 19, 1993

[30] Foreign Application Priority Data

May 19, 1992 [JP] Japan .................. 4-150103

[51] Int. Cl.⁶ .............................. B23Q 5/22
[52] U.S. Cl. .................. 414/19; 198/468.1; 198/746
[58] Field of Search ............... 414/18, 19, 749; 198/468.1, 746

[56] References Cited

U.S. PATENT DOCUMENTS 5,220,997  6/1993  Ushiki et al. .............. 414/19 X

FOREIGN PATENT DOCUMENTS 166764  9/1950  Germany ................. 198/746
0016322  12/1981  Japan ................... 198/746
62-235122  10/1987  Japan .
1-31688  6/1989  Japan .
3-158317  7/1991  Japan .

*Primary Examiner*—Donald W. Underwood
*Attorney, Agent, or Firm*—Koda and Androlia

[57] ABSTRACT

A pusher device for pushing plate-form articles such as lead frames including a pusher for feeding out a lead frame, a pusher supporting plate rotatably holding the pusher and having a stopper section that regulates the rotation of the pusher so as to bring a pushing section of the pusher to a lowest position, a coil spring which urges the pusher toward the stopper section of the pusher supporting plate, a cylinder which reciprocates the pusher supporting plate, and a spring-up operation plate which, cooperative with the stopper section of the pusher supporting plate, defines the rotational movement of the pusher. Thus, the pusher is withdrawn from an area into which the lead frame is transferred and then takes a posture to feed the lead frame to, for example, a bonding machine.

1 Claim, 4 Drawing Sheets

PUSHER DEVICE FOR PLATE-FORM ARTICLES

BACKGROUND OF THE INVENTION

1. Field of the Invention

The present invention relates to a pusher device which feeds plate-form articles such as lead frames to a working device such as bonding machines.

2. Prior Art

One example of a conventional device that conveys plate-form articles such as lead frames, etc. is shown in FIG. 6.

As shown in FIG. 6, a main conveyor 2 is installed in front of a multiple number of working devices 1A, 1B, ... These devices perform the same work such as wire bonding, for example. The lead frames 3 conveyed by the main conveyor 2 are supplied to the respective working devices 1A, 1B, ... in the following manner:

The lead frames 3 are transferred to first subconveyors 4 from the main conveyor 2 and then to points which are above the guide rails 5. Then, the first sub-conveyors 4 are lowered so that the lead frames thereon are placed on the guide rails 5. Afterward, the lead frames 3 are fed out to conveyors 7 by pushing members 6 of a pusher device. The lead frames 3 are fed at fixed intervals by the conveyors 7 and worked by the working devices 1A, 1B, ... After the working is completed, the lead frames 3 are fed out onto guide rails 8 and then conveyed by second sub-conveyors 9 to the main conveyor 2. The lead frames 3 are thereafter transferred to the next process or stored in a storage magazine by the main conveyor 2.

Japanese Patent Application Laid-Open (Kokai) Nos. 62-235122, and 3-158317 and Japanese Patent Application Publication (Kokoku) N. 1-31688 are examples disclosing the conveyor devices of this type.

In the conveyor devices as described above, the lead frames 3 are conveyed onto the guide rails 5 by the first sub-conveyors 4 and then pushed onto the conveyors 7 by the pushing members 6 so that a predetermined working is performed on the lead frames 3. Accordingly, the pushing members 6 are installed so that they are positioned at the rear ends of the lead frames 3 that have been transferred onto the guide rails 5. As a result, when the lead frames of different types that are different in length are to be fed to the working devices, the positions of the pushing members 6 need to be adjusted so as to comply such a different length by moving the pusher device back and forth and otherwise.

As described above, since the pushing members 6 are positioned so as to be at the rear ends of the lead frames 3 on the guide rails 5, if the positions of the pushing members 6 are moved due to the changes in the length of the lead frames, the pushing members 6 may strike against the first sub-conveyors 4. In order to avoid the striking, the pusher may be designed to be vertically movable.

In this type of pusher, when the lead frame guides of the first sub-conveyors 4 are positioned above the guide rails 5, the pusher device is raised so that the pushers 6 can be positioned above the sub-conveyors 4. Then, the sub-conveyors 4 are lowered so that the lead frames 3 thereon are transferred onto the guide rails 5; thereafter, the pusher device is lowered so that the pushing members 6 are positioned at the rear ends of the lead frames 3.

Thus, since a vertical driving means is required to raise and lower the pusher device, the cost of the apparatus tends to be high. In addition, since the pushing members 6 must be actuated after the pusher device has been lowered, the supply of the lead frames 3 to the working devices 1A, 1B, ... is not accomplished immediately.

SUMMARY OF THE INVENTION

Accordingly, the object of the present invention is to provide a pusher device that reduces the cost of the conveyor apparatus and insures a quick pushing action. (7)

More specifically, the present invention achieves the object by a unique structure for a pusher device that includes: a pusher which feeds out plate-form articles (merely called "lead frame(s) in the description below); a pusher supporting plate on which the pusher is provided in a rotatable manner, the pusher supporting plate having a stopper section that regulates the rotation of the pusher in a lead frame feeding direction so that a pushing section of the pusher is positioned low; a pressing means (coil spring) which applies a force that causes the pusher to contact the stopper section of the pusher supporting plate; a driving source (or a reciprocating means) which reciprocates the pusher supporting plate; and spring-up operation plate by which the pusher, overcoming the force of the pressing means, is rotated back in the direction opposite from the lead frame feeding direction immediately before the completion of the movement of the pusher in the direction opposite from the lead frame feeding direction.

When the lead frame is brought under the pusher device, the pusher is kept raised (in a raised position) via the spring-up operation plate so that the pushing section of the pusher is not in a space into which the lead frame is transferred.

When the pusher supporting plate is about to move (in the lead frame feeding direction) by the reciprocating means after the lead frame has been brought under the pusher device, the pusher is first separated from the spring-up operation plate and caused to rotate by the pressing means until the pusher comes into contact with the stopper section of the pusher supporting plate. This positions the pushing section of the pusher to be low so that the pushing section is behind the rear end of the lead frame. Thereafter, the pusher supporting plate is advanced in the lead frame feeding direction by the reciprocating means. This causes the pusher to push against the rear end of the plate-form article, so that the lead frame is fed out of the pusher device.

After the plate-form article has been fed out the pusher supporting plate is moved back by the reciprocating means. During this backward movement, the pusher is kept pressed against the stopper section of the pusher supporting plate until the pusher comes into contact with the spring-up operation plate. When the pusher is brought into contact with the spring-up operation plate, the pusher is rotated back via the spring-up operation plate in the direction opposite to the lead frame feeding direction, thus bringing the pushing section of the pusher to its raised position.

DETAILED DESCRIPTION OF THE INVENTION

One embodiment of the present invention will be described below with reference to FIGS. 1 through 5.

The embodiment includes a guide means 10 which guides a lead frame 3 to a working device, a sub-conveyor 20 which guides the lead frame 3 into the guide means 10 in a direction perpendicular to the guide-direction of the guide means 10, and a pusher device 40 which transfers the lead frame 3 that are on the guide means 10 onto the working device.

Figure 1:
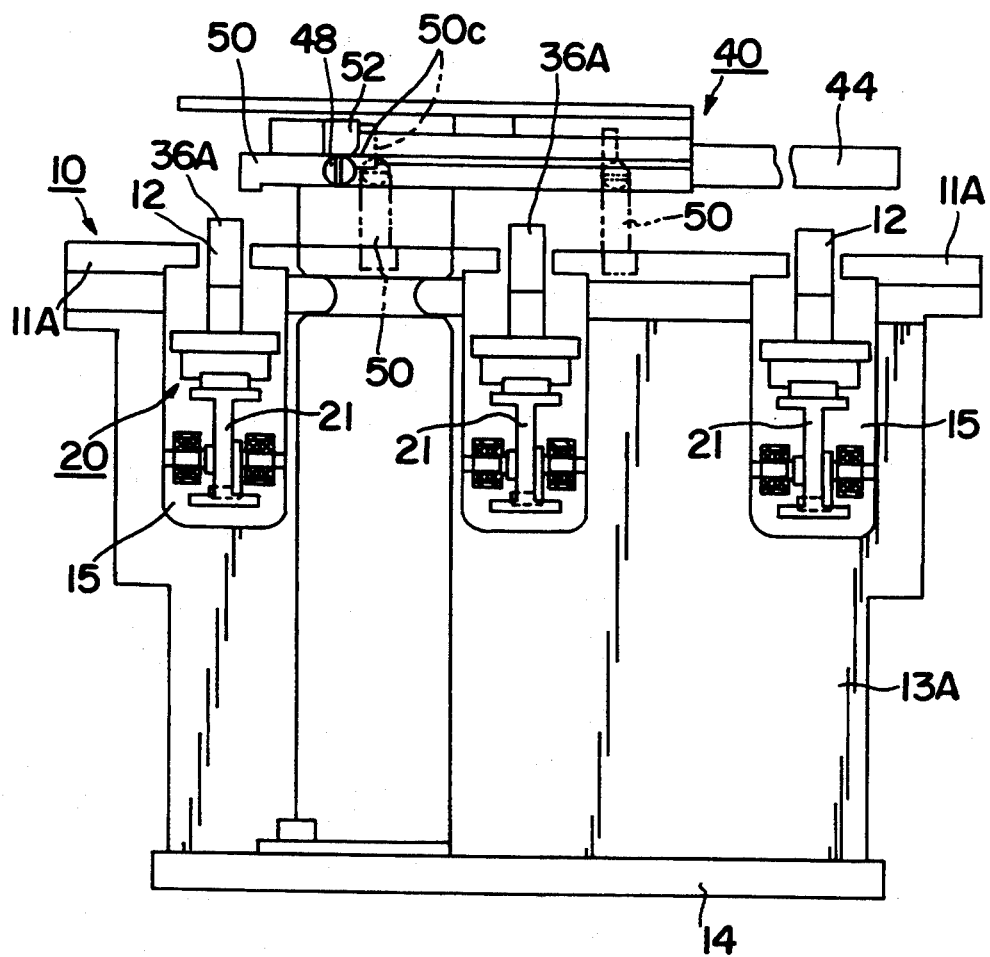
FIG. 1 is a front view of one embodiment of the pusher device according to the present invention.
Figure 2:
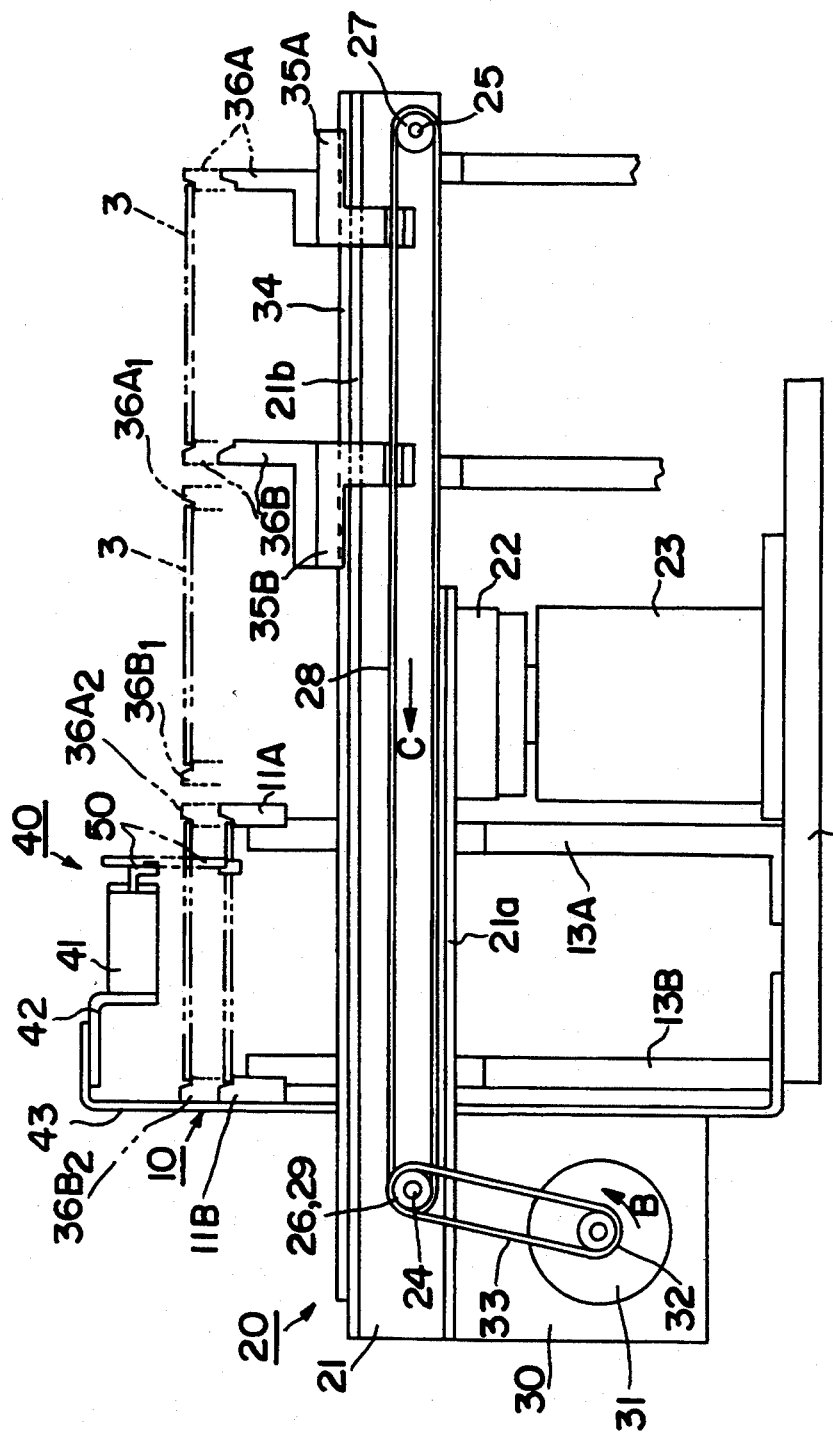
FIG. 2 is a left side view thereof.

In the guide means 10, as shown in FIGS. 1 and 2, two guide rails 11A and 11B which guide the lead frame 3 are installed so as to face each other. There are gaps 12 formed between the guide rails 11A and 11B. These guide rails 11A and 11B are respectively installed on rail supports 13A and 13B, and the rail supports 13A and 13B are mounted on a base plate 14. Spaces 15 are formed in the rail supports 13A and 13B in areas corresponding to the gaps 12.

Each one of three sub-conveyors 20 includes, as shown in FIGS. 1 and 2 (particularly in FIG. 2), a conveyor supporting frame 21 which runs throughout the space 15. The bottom plates 21a of the conveyor supporting frames 21 are connected together by a connecting plate 22 so as to be an integral unit. The connecting plate 22 is secured to the operation section of a cylinder 23 which is mounted on the base plate 14.

A drive shaft 24 and a driven shaft 25 are installed so as to pass through the respective conveyor supporting frames 21. Both ends of the drive shaft 24 and the driven shaft 25 are supported on the two outside conveyor supporting frames 21 (right and left supporting frames 21 in FIG. 1) via bearings (not shown). The shafts 24 and 25 are rotatable. Timing pulleys 26 and 27 are provided on the drive and driven shafts 24 and 25, respectively, so that the pulleys are located inside the conveyor supporting frames 21. Between these timing pulleys 26 and 27, timing belts 28 are installed.

One end of the drive shaft 24 is projected out of one of the outside conveyor supporting frames 21, and a timing pulley 29 is fastened to this projected end. A motor supporting plate 30 is secured to the bottom plate 21a of the outside conveyor supporting frame 21, and a motor 31 is mounted to the motor supporting plate 30. A timing belt 33 is installed between the timing pulley 29 and a timing pulley 32 which is mounted on the output shaft of the motor 31.

A slider guide 34 is provided on the upper plate 21b of each one of the conveyor supporting frames 21, and a pair of sliders 35A and 35B are installed on each slider guide 34. These sliders 35A and 35B are connected to the timing belts 28. Frame-holders 36A and 36B which hold the lead frame 3 are provided on the sliders 35A and 35B so that the frame-holders 36A and 36B are in respectively identical positions.

Furthermore, as shown in FIGS. 1 and 2, the pusher device 40, which essentially comprises a pusher, a pusher supporting plate, a pressing means, a driving source and a spring-up plate which will be described below, is provided on the guide rails 11A and 11B.

More specifically, a pusher mount 43 is secured to a base plate 14 at its bottom end, and an attachment plate 42 is secured to the top end of the pusher mount 43. An attachment plate 42 is fastened to the pusher mount 43, and a square pusher frame 41 is secured to the attachment plate 42 so that the pusher frame 41 locates above the space between the guide rails 11A and 11B.

Figure 3:
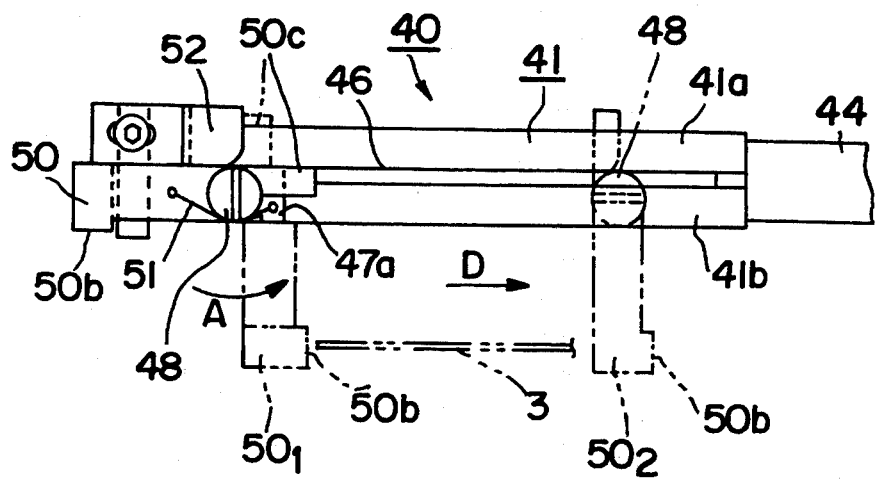
FIG. 3 is a front view of the essential part of the pusher device of the present invention.
Figure 4:
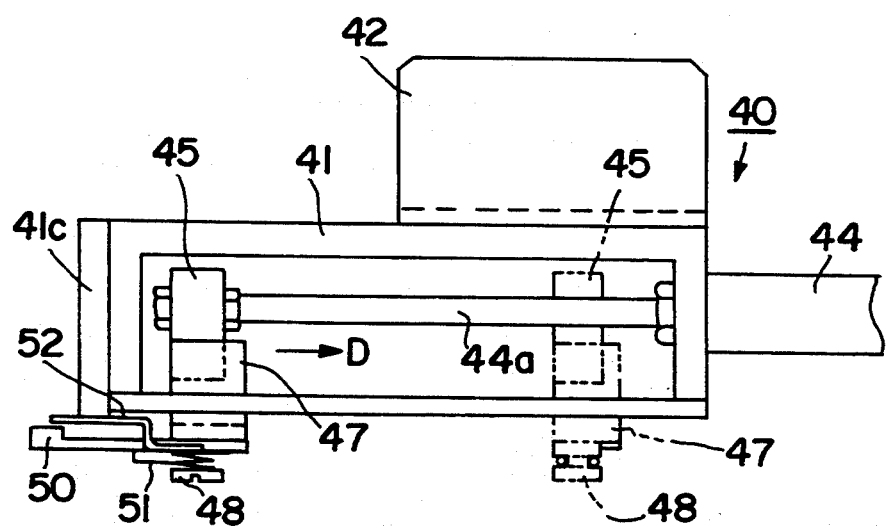
FIG. 4 is a top view thereof.
Figure 5:
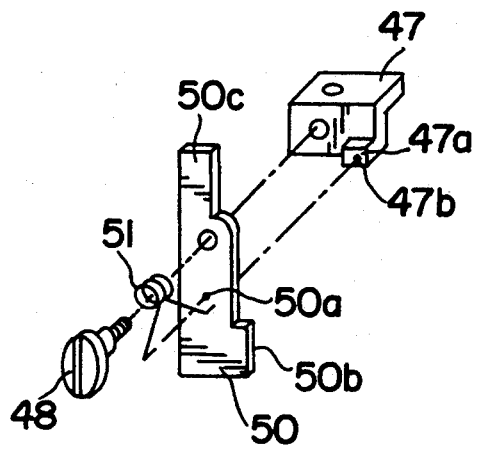
FIG. 5 is a perspective view of the disassembled pusher supporting plate and pusher which are used in the pusher device of the present invention.

As shown in FIGS. 3, 4 and 5, a cylinder 44, which is a driving source, is mounted to the pusher frame 41, and an operation block 45 is attached to one end of the cylinder rod 44a of the cylinder 44. The cylinder rod 44a makes a reciprocation motion.

Upper and lower side plates 41a and 41b are provided on one side of the pusher frame 41 with a space in between, thus forming a guide groove 46 which is parallel to the cylinder 44. The operation block 45 attached at the end of the cylinder rod 44a is provided with a pusher supporting plate 47, and one end of the supporting plate 47 is brought into the guide groove 46. A supporting shaft 48 is secured to the end surface of the pusher supporting plate 47.

A pusher 50 is rotatably mounted to the supporting shaft 48. The rotation or a pivot motion of the pusher 50 in the direction of arrow A is regulated by a stopper section 47a of the pusher supporting plate 47. The stopper section 47a is out of the pusher frame 41.

Furthermore, a returning coil spring (or pressing means) 51 is provided on the supporting shaft 48. More specifically, one end of the coil spring 51 is anchored in a hole 50a formed in the pusher 50, and the other end of the spring 51 is anchored in a hole 47b formed in the stopper section 47a of the supporting plate 47. With this spring 51, the pusher 50 is urged to be in contact with the stopper section 47a.

The pusher 50 is formed with a spring-up projection 50c, that is used to make a spring-up action of the pusher 50, at one end and a pushing section 50b at the other end.

Furthermore, a spring-up operation plate 52 which acts on the spring-up projection 50c of the pusher 50 is fastened to the end plate 41c of the pusher frame 41. The spring-up operation plate 52 is located on the opposite side from the cylinder 44. The rotation or a pivotal movement of the pusher 50 is regulated so as to be within approximately 90 degree range between the spring-up operation plate 52 and the stopper section 47a of the pusher supporting plate 47.

Figure 6:
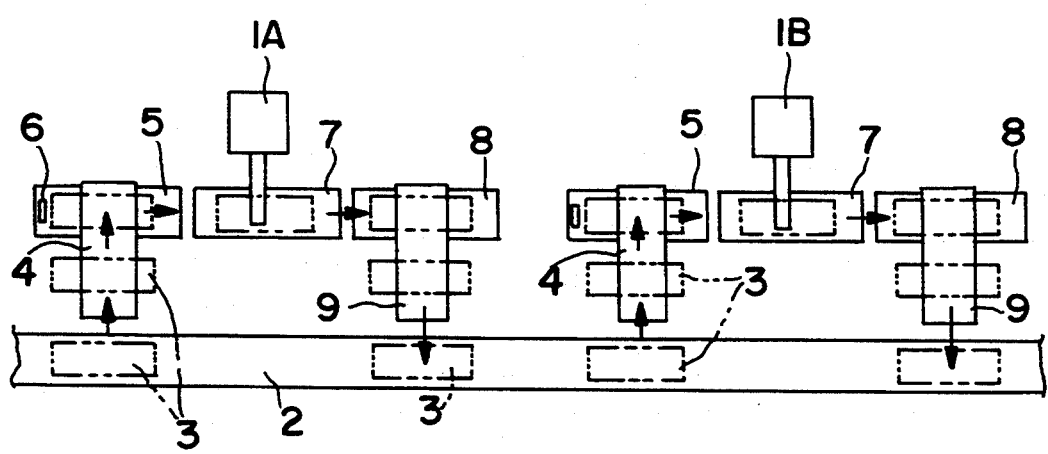
FIG. 6 is a top view schematically illustrating the structure and conveying sequence of an existing conveyor apparatus.

The operation of the above described embodiment will be described below:

When the lead frame 3 which has been conveyed by the main conveyor 2 (not shown in the Figures, but see FIG. 6) is positioned and stopped above the frame-holders 36A and 36B with the frame-holders 36A and 36B positioned as shown by the solid lines in FIG. 2 (i.e., at the right-hand end in FIG. 2), the cylinder 23 is actuated. The operating rod of the cylinder 23 is extended. This causes the conveyor supporting frames 21, and therefore, the frame-holders 36A and 36B too, to be raised so that the lead frame 3 on the main conveyor 2 can be moved onto the frame-holders 36A and 36B.

Next, the motor 31 is driven so that the timing pulley 32 is rotated in the direction of arrow B. The resulting rotation of the timing belt 33 is transmitted via the timing pulley 29 and the timing pulleys 26 and 27 so that the timing belt 28 is rotated in the direction of arrow C. As a result, the frame-holders 36A and 36B are moved and then wait at the positions indicated by $36A_1$ and $36B_1$.

Then, if there is no lead frame on the guide rails 11A and 11B, the motor 31 is driven again. As a result, the timing pulley 32 is rotated to bring the frame-holders 36A and 36B above the guide rails 11A and 11B as indicated by $36A_2$ and $36B_2$. At this moment, the pusher 50 is in a raised position (as shown by the solid line in FIG. 3) and not in the area between the guide rails 11A and 11B. Thus, the move-in movement of the lead frame 3 is not hindered by the pusher 50.

Next, the cylinder 23 is actuated in the direction opposite from the direction of the previous raising motion. In other words, the cylinder 23 is actuated to retract the operating rod of the cylinder 23. As a result, the frame-holders 36A and 36B are lowered, and the lead frame 3 on the frame-holders 36A and 36B is transferred onto the guide rails 11A and 11B. Afterward, the motor 31 is driven in the direction opposite from the previous direction so that the frame-holders 36A and 36B are returned to their original positions (which is indicated by the solid lines).

Then, the pusher device 40 is actuated. The pusher device 40 is actuated when the working device (shown in FIG. 6) is ready to start working on the lead frames 3. The pusher device 40 works in the following manner:

First, the cylinder rod 44a of the cylinder 44 (see FIG. 3), which is a driving source for the pusher supporting plate 47, starts to be retracted, and the pusher supporting plate 47 is moved in the direction of arrow D.

When the pusher supporting plate 47 is moved in the direction of arrow D, the spring-up projection 50c of the pusher 50 is separated from the spring-up operation plate 52, and the pusher 50 is forced to rotate about the supporting shaft 48 in the direction of arrow A by the driving force of the returning coil spring 51. The rotation of the pusher 50 is stopped when the rotating pusher 50 comes into contact with the stopper section 47a of the pusher supporting plate 47. As a result, the pusher 50 takes a posture indicated by $50_1$. In other words, the pushing section 50b of the pusher is positioned low behind the rear end of the lead frame 3.

Afterward, the pusher 50 is moved, together with the pusher supporting plate 47, in the direction of arrow D by the cylinder rod 44a and positioned as indicated by $50_2$. With this movement of the pusher 50, the lead frame 3 is pushed by the pushing section 50b of the pusher 50 and is fed into the working device. In the above description, the direction indicated by arrow D is the "plate-form article feeding direction."

After the lead frame 3 has been fed out, the operating rod 44a of the cylinder 44 is extended so that the pusher 50 is moved in the direction opposite from the direction of arrow D. In other words, the pusher is moved in a direction opposite from the plate-form article feeding direction.

In this backward movement, when the pusher 50 is moved from the position indicated by $50_2$ to the position indicated by $50_1$, the spring-up projection 50c of the pusher 50 comes into contact with spring-up operation plate 52. When the pusher supporting plate 47 is moved even further, the spring-up projection 50c of the pusher 50 hits the spring-up operation plate 52, and the pusher 50 is rotated back in the direction opposite from the direction of arrow A. As a result, the pushing section 50b of the pusher 50 is caused to spring up and withdraw from the area defined between the guide rails 11A and 11B. Thus, a next lead frame can be fed into the area between the guide rails 11A and 11B so as to be fed out by the pusher 50.

In the above description, the pusher 50 is located outside the vertical plane of the movement track of the frame-holders 36A and 36B when the pusher 50 is in the position indicated by $50_1$. Thus, the pusher 50 can remain in the position indicated by $50_1$ at all times. In other words, there might be no need to make a spring-up action of the pusher 50 to take the pusher 50 out of the area between the guide rails 11A and 11B.

However, if lead frames of different length are to be pushed by the pusher 50 and the rear ends of such each lead frames conveyed by the frame-holders 36A and 36B are on the center frame-holders 36A and 36B (of the three sets of frame-holders 36A and 36B, see FIG. 1), the pusher 50 might hinder the movement of the center frame-holders 36A and 36B as long as the pusher 50 is positioned as indicated by $50_1$ wherein the pushing section 50b of the pusher 50 is at the rear end of the lead frame 3. If in this case, the pusher 50 was in the position indicated by $50_1$, the frame-holders 36A and 36B would strike the pusher 50 when the lead frame was conveyed toward the guide rails 11A and 11B by the frame-holders 36A and 36B.

In this respect, the present invention is designed so that a slight movement of the pusher 50 from the position of $50_1$ in the direction opposite to the arrow D direction can cause the spring-up projection 50c of the pusher 50 to be pushed by the spring-up operation plate 52 and rotate the pusher 50 so that the pushing section 50b of the pusher 50 is brought above the frame-holders 36A and 36B. Accordingly, when the lead frame is moved toward the guide rails 11A and 11B by the frame-holders 36A and 36B, it is avoided that the frame-holders 36A and 36B collide against the pusher 50.

As seen from the above, the present invention provides a pusher device of a simple structure which includes a pusher that is rotatably supported on a pusher supporting plate and driven by a returning coil spring and also includes a spring-up operation plate. Thus, the cost of the apparatus can be low, and the pusher can be actuated immediately after each lead frame is transferred onto the guide rails of the working conveyor line.

According to the present invention, the pusher device includes: a pusher which feeds out a lead frame; a pusher supporting plate has the pusher in a rotatable fashion, the pusher supporting plate being formed with a stopper section that regulates the rotation of the pusher in the lead frame feeding direction so that the pushing section of the pusher can take a low position; a pressing means (a coil spring) which applies a force to the pusher so that the pusher contacts the stopper section of the pusher supporting plate; a driving source (a cylinder) which reciprocates the pusher supporting plate; and a spring-up operation plate which, overcoming the force of the pressing means, causes the pusher to rotate back in the direction opposite from the lead frame feeding direction immediately before the completion of the pusher's movement that is in the direction opposite to the lead frame feeding direction.

I claim:

1. A pusher device for pushing a lead frame comprising:

a pusher frame with a guide groove formed on one side thereof;

a cylinder provided on one end of said pusher frame, a cylinder rod of said cylinder reciprocating parallel to said guide groove in said pusher frame;

a spring-up operation plate provided on another end of said pusher frame;

a pusher supporting plate provided at an end of said cylinder rod of said cylinder, one end of said pusher supporting plate being projected out of said pusher frame through said guide groove, and a stopper section being formed on said projected end;

a pusher installed on said projected end of said pusher supporting plate via a supporting shaft, said pusher being rotatable about said supporting shaft within approximately 90 degree range between said spring-up operation plate and said stopper section of said pusher supporting plate; and a coil spring provided on said supporting shaft, one end of said coil spring being connected to said pusher supporting plate and another end of said coil spring being connected to said pusher, thus urging said pusher away from said spring-up operation plate;

whereby said pusher rotates to an operative position when said pusher supporting plate is reciprocated by said cylinder in a lead frame feeding direction and said pusher is separated from said spring-up operation plate; and said pusher rotates to an inoperative position when said pusher is retracted by said cylinder and said pusher contact said spring-up operation plate.

* * * * *